United States Patent [19]

Nambu et al.

[11] Patent Number: 5,041,796
[45] Date of Patent: Aug. 20, 1991

[54] WIDEBAND AMPLIFIER USING FET

[75] Inventors: Shutaro Nambu, Uji; Yasuhisa Yamashita, Takatsuki; Kazuhide Goda, Nagaokakyo, all of Japan

[73] Assignee: Matsushita Electric Industrial Co., Ltd., Osaka, Japan

[21] Appl. No.: 498,901

[22] Filed: Mar. 26, 1990

[30] Foreign Application Priority Data

Mar. 30, 1989 [JP] Japan .................................. 1-80325

[51] Int. Cl.$^5$ .............................................. H03F 3/16
[52] U.S. Cl. ...................................... 330/277; 330/307
[58] Field of Search .............. 330/149, 277, 294, 300, 330/302, 306, 307

[56] References Cited

U.S. PATENT DOCUMENTS 4,853,649  8/1989  Seino et al. ........................ 330/54 X

FOREIGN PATENT DOCUMENTS 0085610  5/1985  Japan ................................. 330/277

Primary Examiner—Steven Mottola
Attorney, Agent, or Firm—Stevens, Davis, Miller & Mosher

[57] ABSTRACT

The amplifier employs an FET having a flat characteristic of mutual conductance versus the potential gap between the gate and the source of the FET. By employing this FET, the amplifier achieves a sufficiently flat gain characteristic in which the gain deviation is very small throughout the range of the objective frequencies.

6 Claims, 6 Drawing Sheets

EQUIVALENT CIRCUIT OF GaAs WIDEBAND AMPLIFIER

EQUIVALENT CIRCUIT OF GaAs WIDEBAND AMPLIFIER

FREQUENCY DEPENDENCY OF GAIN OF AMPLIFIER gm vs. VGS CHARACTERISTIC OF CONVENTIONAL GaAs FET

WIDEBAND AMPLIFIER USING FET

BACKGROUND OF THE INVENTION

The present invention relates to a wideband amplifier which serves to reduce a second order distortion particularly in UHF and VHF bands.

In receiving multi-channel signals in a wide range, these signals are subject to mutual interference, thereby disadvantageously causing distortions of the signals. Those distortions result from nonlinearity of an active device in a signal processing circuit. Though a number of high degree distortions may be brought about, the second degree and third degree distortions are the most significant ones caused in the active device used for signal processing. In particular, in a system for receiving signals in a VHF to UHF band such as a front-end amplifier of a cable television converter or a RF (Noise Frequency) modulator connected with a booster used in a video tape recorder, the second order distortion has to be carefully considered.

For wideband signal processing, a wideband bipolar transistor device or an FET (Field-Effect Transistor) consisting of a compound semiconductor may be employed. The bipolar transistor, however, has so inferior a noise figure that it gives rise to a large signal distortion. As a result, recently systems for processing signals in the VHF or UHF band often employ a compound semiconductor device such as a GaAs FET.

To describe such a wideband signal processing circuit, reference can be made to a wideband amplifier having a territory of a VHF to UHF band, in particular, a negative feedback amplifier consisting of a compound semiconductor such as a GaAs FET. FIG. 5 is an equivalent circuit of the GaAs wideband amplifier. FIG. 6 shows an example of the frequency dependence of the gain in this amplifier. It is assumed that a feedback resistance $R_f$ 12 is 300 Ω, a gate bias resistance $R_G$ 13 is 10 kΩ, FET 11 has a gate width of 800 μm, a gate length of 1 μm and a mutual conductance of 80 mS, and the consumed current $I_{DD}$ is about 30 mA. 14 denotes a choke coil $C_f$ for supplying bias current and 15 denotes a feedback capacitor for d.c. blocking.

When the wideband amplifier receives at an input terminal IN multi-channel signals over 64 to 80 channels (50 $MH_b$ to 500 $MH_b$) in the VHF to UHF band, nonlinearity entailed in an element itself gives rise to second order and third order distortions of a signal. As noted above, the wideband amplifier used for the cable television converter requires such distortions to be strictly suppressed. The conventional GaAs FET, in essence, has a feature that only a small third order distortion is brought about. The present inventors, however, have discovered through their research that a large second order intermodulation distortion caused by the GaAs FET made it difficult for the FET to achieve the satisfactory efficiency for the intended use as an amplifier, in spite of the superior features of the FET in lowering noise.

To select an FET used for the amplifier, traditionally, high-frequency inspection has been manually done for large numbers of manufactured GaAs FETs one-by one in order to select an FET having a low noise and a small second order distortion. This was necessary because it has been so difficult to obtain a GaAs FET having a small second order distortion and a low noise.

The result was that on average just one satisfactory GaAs FET could be found among 70 FETs. This result indicates that it has been difficult to obtain a proper GaAs FET and the inspection has required a lot of labor and high cost, with the result that the GaAs FET amplifier has not been so easily manufactured.

SUMMARY OF THE INVENTION

It is an object of the present invention to provide a wideband amplifier which is superior in a second order distortion characteristic.

It is a further object of the present invention to provide a wideband amplifier which serves to give only a low noise and is superior in a second order distortion characteristic when the amplifier currently receives multi-channel signals in a wide frequency range such as a UHF and a VHF bands.

It is an other object of the present invention to provide an automatic inspection process employing a low frequency or direct current which enables easy selection of an FET having a superior second order distortion characteristic in a VHF to VHF band.

The present invention provides a wideband amplifier having a superior second order distortion characteristic, because it employs a field-effect transistor having a flat area of mutual conductance $g_m$ with respect to the center of an operation point of $V_{GS}=0V$ in the characteristic of $g_m$ versus a voltage $V_{GS}$ between a gate and a source (referred to as a gate-source voltage).

That is, in an amplifier which serves to concurrently receive multi-channel signals in a wide frequency range such as UHF and VHF bands and amplify them, the present invention achieves a wideband amplifier which employs as an amplifying semiconductor element a field-effect transistor having a substantially flat characteristic of mutual conductance versus the gate-source voltage with respect to the center of the operation point for suppressing second order distortion components in an output.

Further, the invention provides a wideband amplifier which effectively suppresses a second order distortion in a high frequency to be a constant value as a result of passing a field-effect transistor if the difference between mutual conductances to applied voltages at an input terminal having a constant difference therebetween is equal to or less than a constant value in case of inspecting a field-effect transistor.

DESCRIPTION OF THE PREFERRED EMBODIMENTS

The principle of the invention is based on the fact experimentally recognized by the present inventors, who have analyzed the characteristics of an FET composing its wideband amplifier and a second order distortion characteristic.

Traditionally, the second order distortion has resulted from nonlinearity of $g_m$ of an FET and gate capacitance. However, as a result of studying the relationship between the proper characteristic of the FET and the second order distortion, the present inventors have found out that there exists large correlation between a difference $\Delta g_m$ between both mutual conductances $g_m$ to voltages applied at an input terminal and a second order distortion caused in the cable television converter.

Figure 7:
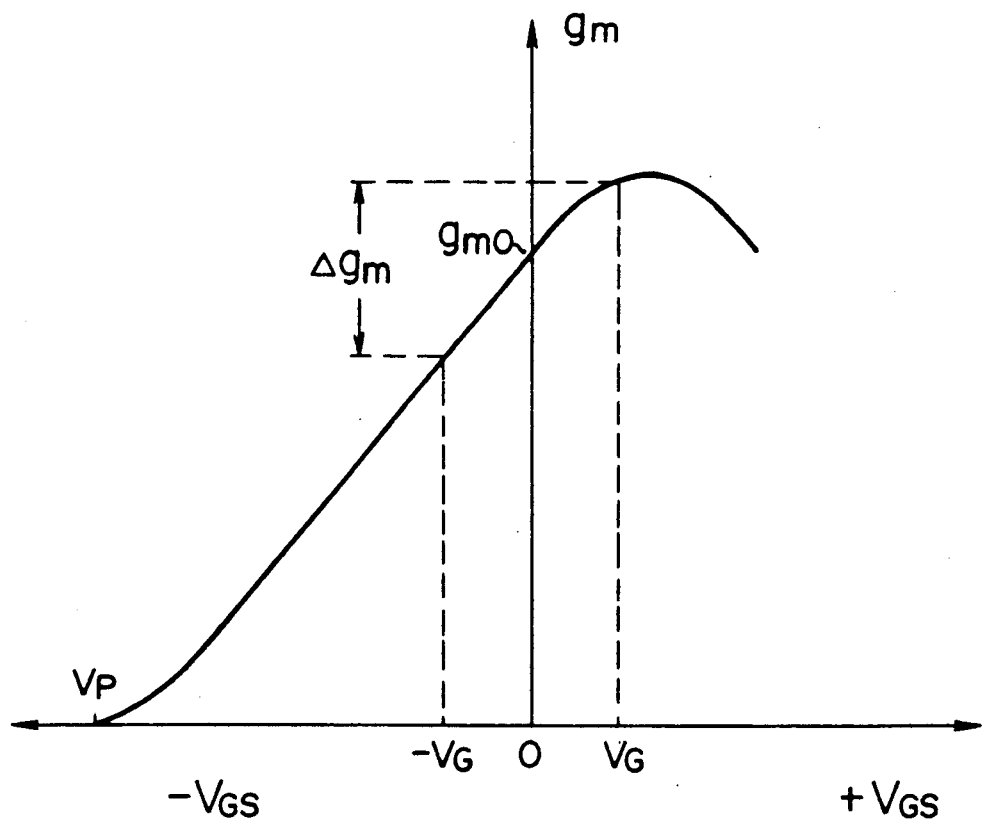
FIG. 7 is a curve of the $g_m$ - $V_{GS}$ relationship of a conventional GaAs FET.

FIG. 7 shows the relationship between the mutual conductance $g_m$ and the gate-source voltage $V_{GS}$ of a compound semiconductor normally used in a wideband amplifier, for example, a GaAs field-effect transistor (FET). A normal GaAs FET has a gradient of $g_m$ as shown in FIG. 7. The FET is allowed to operate by setting an operation point on the curve with the gradient and applying a signal positioned between $-V_G$ to $V_G$ to a gate.

Figure 4:
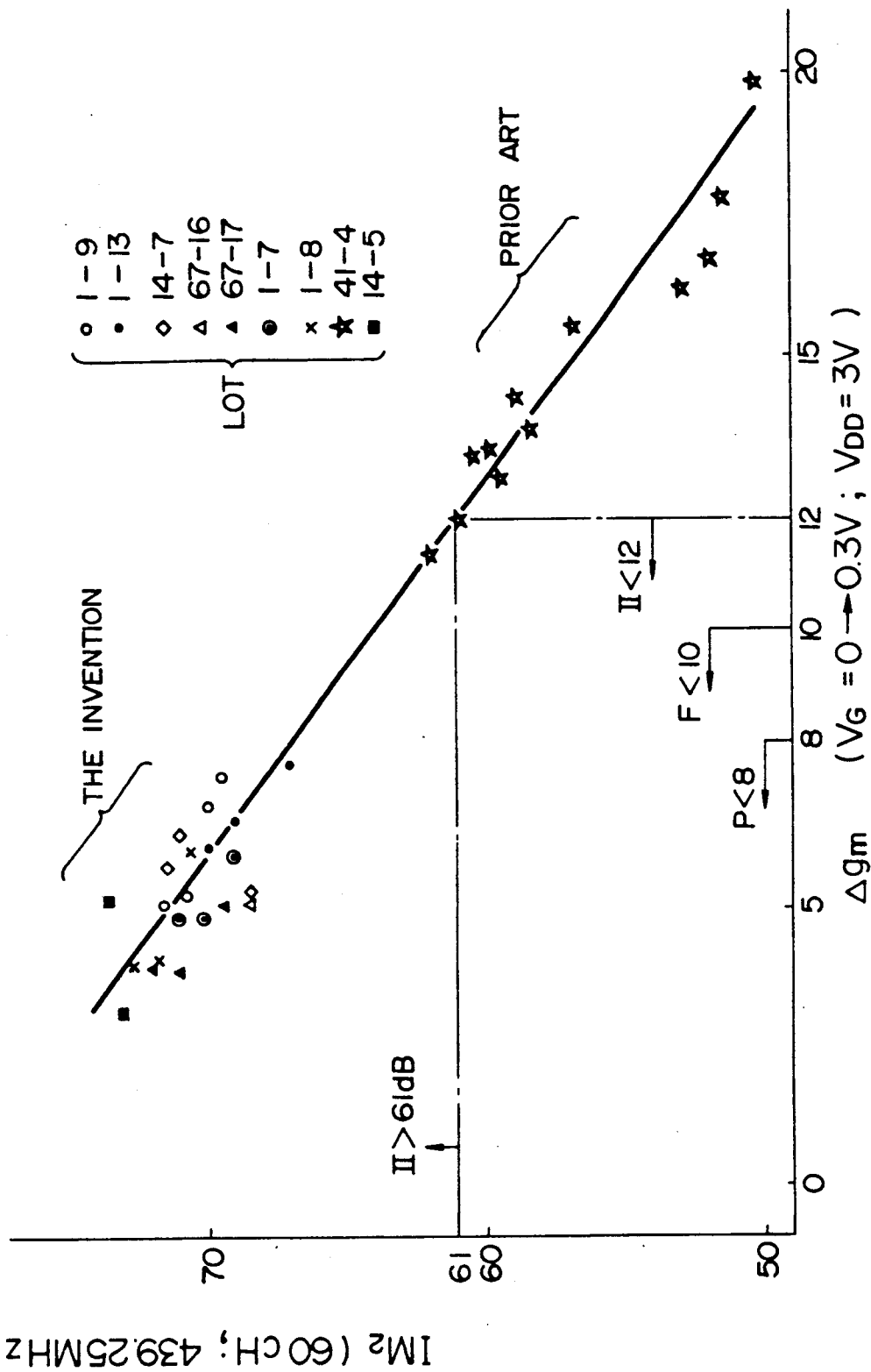
FIG. 4 is a graph showing the $\Delta g_m$ - $IM_2$ relationship of the FET.

The present inventors have researched the relationship between the difference $\Delta g_m$ between $g_m$ of $V_G = \pm 0.3$ V and a second order intermodulation distortion (IM$_2$) caused in the cable television converter. FIG. 4 shows the results of this research.

Figure 8A:
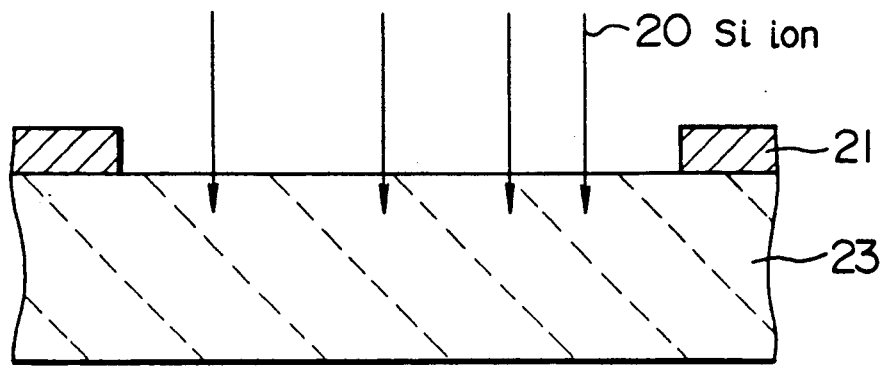
FIG. 8A, 8B and 8C are schematic views showing the manufacturing step of the GaAs FET.
Figure 8B:
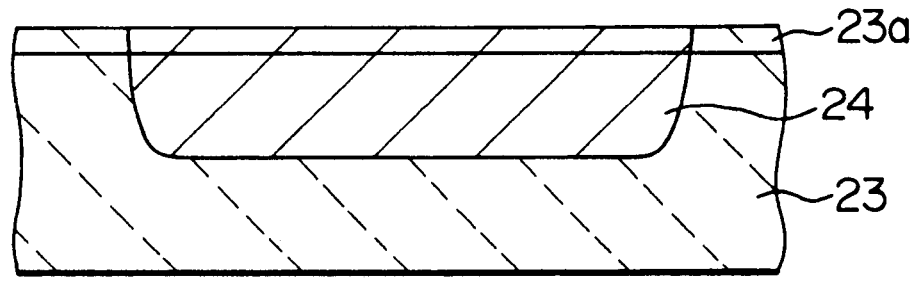
Figure 8C:
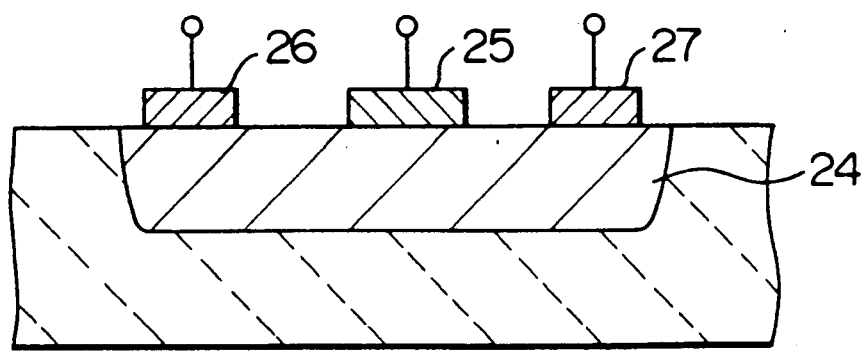

The GaAs FET is normally manufactured by the process shown in FIG. 8. The process comprises the steps of forming a mask 21 on a semi-insulated GaAs substrate; implanting Si-ions 20 as an impurity (FIG. 8A) for forming an active layer 24 in which the FET is formed; etching, that is, adjustably etching a surface portion 23a for realizing a proper characteristic (FIG. 8B); and forming a Schottky gate electrode 25, a source electrode 26, and a drain electrode 27 for forming an FET (FIG. 8C).

In addition, the Si-ion implantation condition except No. 41-4 is indicated in the below TABLE.

[TABLE]

| Implantation Condition LOT No. | Accelerating Voltage (keV) | Dose Amount $\times 10^{12}$ cm$^{-3}$ | Etching |
| --- | --- | --- | --- |
| 1 to 9 | 120 | 5 | 1000Å |
| 1 to 13 | 70 | 5 | 1000Å |
| 14 to 7 | 70 | 3 | 500Å |
| 67 to 16 | 70 | 5 | 1000Å |
| 67 to 17 | 120 | 3 | 400Å |
| 1 to 7 | 120 | 5 | 500Å |
| 1 to 8 | 120 | 3 | 200Å |
| 14 to 5 | 120 | 3 | 200Å |

FIG. 4 shows the relationship between $\Delta g_m$ and a second order intermodulation distortion (IM$_2$) in a wideband amplifier employing an FET (trial lot No. 41-4 shown in FIG. 4) whose active layer 24 is formed by implanting Si-ion under the condition of 70 KeV accelerating voltage and $7 \times 10^{12}$ dose amount or an FET (any one except the trial lot No. 41-4) manufactured in such a trial and error manner as varying the Si-ion implantation condition.

As shown in FIG. 4, it is to be understood that as $\Delta g_m$ becomes smaller, IM$_2$ becomes more excellent. This result indicates the fact that as $\Delta g_m$ becomes smaller, that is, as the used FET has a flatter mutual conductance characteristic with respect to the center of the operation point, the second order intermodulation distortion (IM$_2$) becomes superior. This also indicates that the smallest value of the first order differential coefficient $\sigma g_m / \sigma V_{GS}$ to the gate voltage $V_{GS}$ of $g_m$ is important in reducing IM$_2$. That is, it has been discovered that the FET having a smaller gradient of $g_m$, in other words, a flat $g_m$ on the operation point has an effect on reduction of the IM$_2$. This fact has been first discovered by the present inventors.

Figure 1:
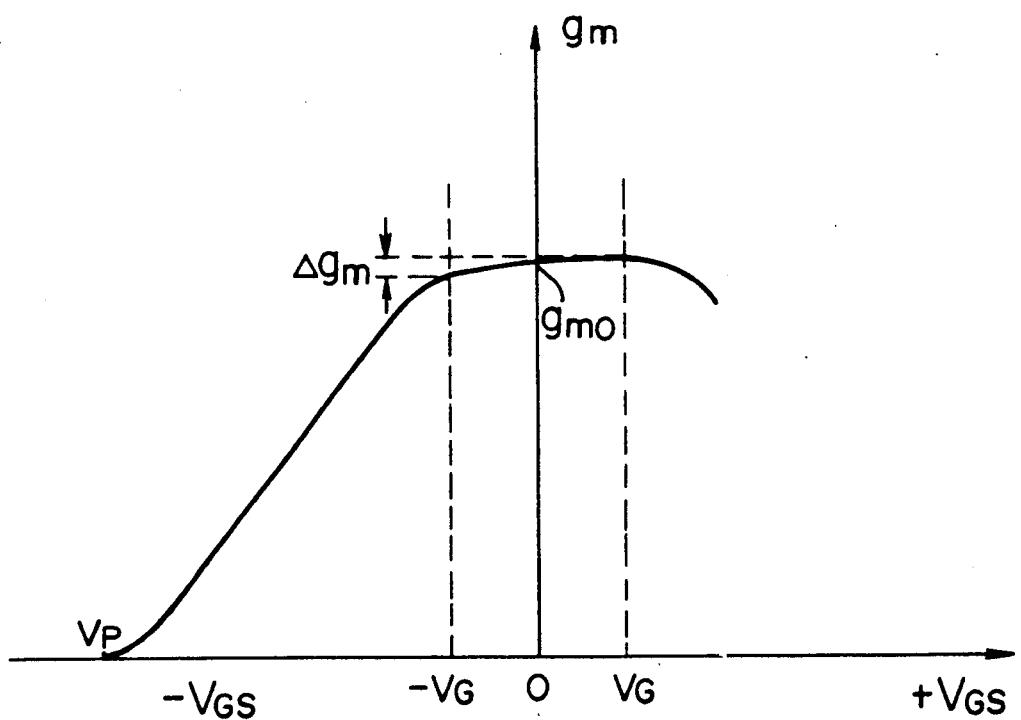
FIG. 1 is a characteristic curve of $g_m$ to $V_{GS}$ in a GaAs FET according to one embodiment of the invention.
Figure 5:
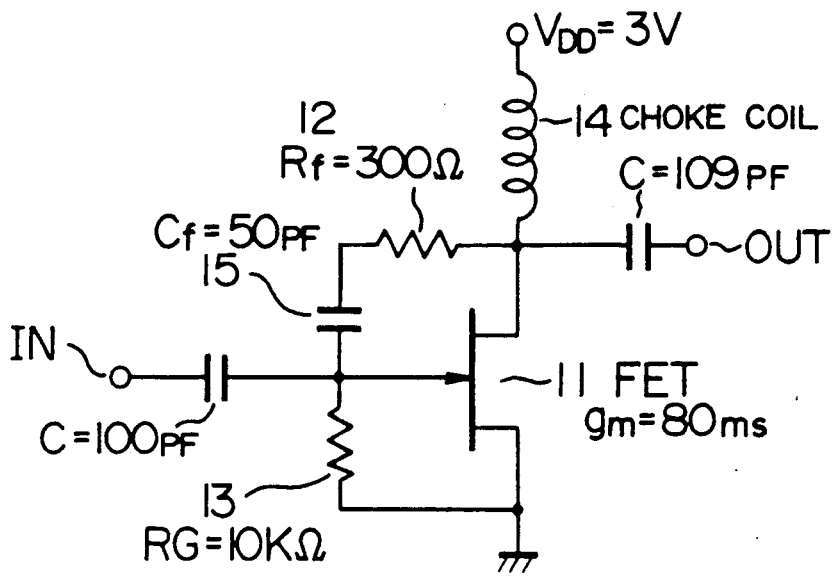
FIG. 5 is an equivalent circuit diagram of a GaAs wideband amplifier.
Figure 6:
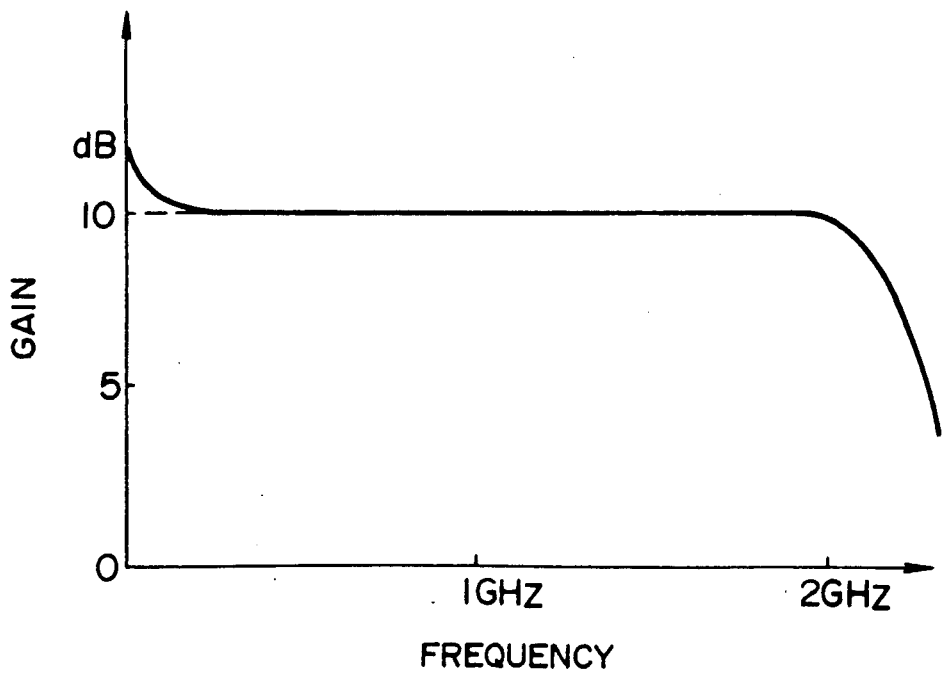
FIG. 6 is a graph showing frequency dependence of a gain in the wideband amplifier.

Hereinafter, a description will be directed to a wideband amplifier according to one embodiment of the invention employing a GaAs FET. The circuit diagram of the amplifier is identical to that shown in FIG. 5. In this diagram, $V_{GS} = 0$ V is denoted as an operation point. The present invention has the following significantly different feature from the conventional device, wherein the used FET has a substantially flat area of $g_m$ with respect to the center of the operation point of $V_{GS} = 0$ v in the characteristic of $g_m$ (mutual conductance) to $V_{GS}$ (voltage between gate and source) as shown in FIG. 1. The value of $\Delta g_m$ is suppressed to be 8 mS or less in the range of $V_{GS} = 0$ v and 20% or less of the value of $g_{m0} = 70$ mS given in the case of $V_{GS} = 0$ v. The present invention employs the FET having the foregoing condition for its wideband amplifier.

Figure 2:
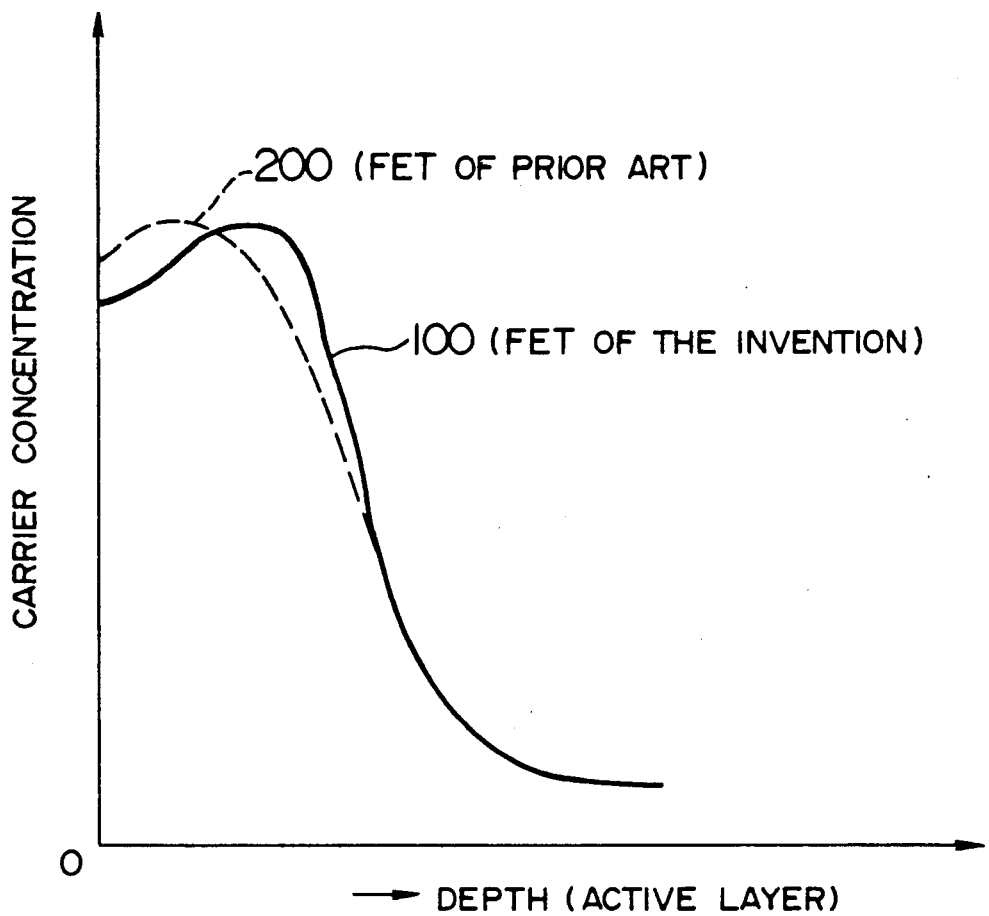
FIG. 2 is a curve showing a doping carrier profile of the FET according to the embodiment of the invention.
Figure 3:
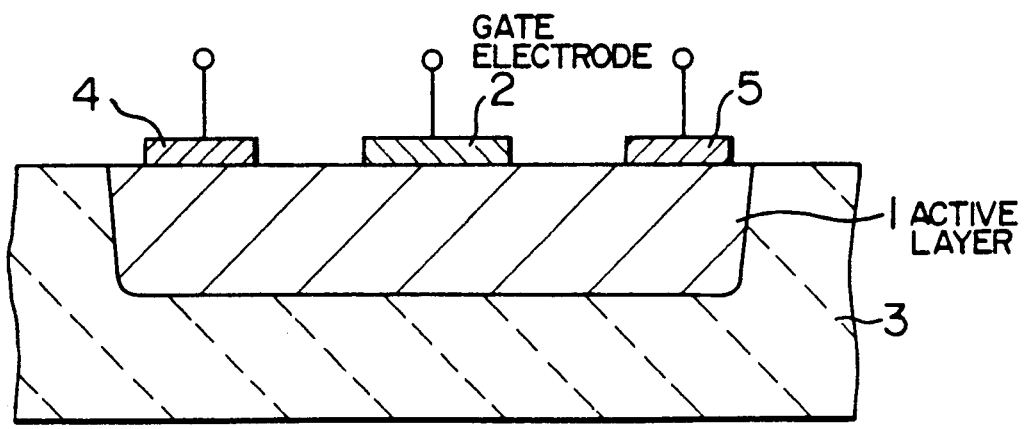
FIG. 3 is a sectional view of the FET.

The FET used in the invention is shown in FIG. 1. The FET shown in FIG. 1 is identical to that shown in FIG. 8 except with respect to the characteristic shown in FIG. 1. The carrier doping profile, as shown in FIG. 2, is smaller than the conventional one near the surface of the Schottky gate electrode 2 and is higher in a deep portion of the electrode 2. 100 denotes an FET carrier doping profile for the invention, 200 denotes a carrier doping profile for a conventional FET, 3 denotes a semi-insulated GaAs substrate, 4 denotes a source electrode, and 5 denotes a drain electrode.

The carrier doping profile 100 can be obtained by properly selecting any one except the LOT No. 41-4. For example, it could be implemented by using the Si-ion implantation condition of an accelerating voltage of 120 KeV and a dose amount of $3 \times 10^{12}$ cm$^{-3}$ and an FET gate width of 800 $\mu$m and adjustably etching the thickness of an active layer 1 so as to have a drain saturation current I$_{pss}$ of 30 to 50 mA. This FET gives a larger accelerating voltage and a smaller dose amount than the conventional FET for reducing the adjustably etched amount.

The foregoing ion implantation condition was obtained by doing a trial and error search for the most proper condition among several conditions that $\Delta g_m$ shown in FIG. 4 becomes smaller. In general, by lowering the accelerating voltage, pushing a peak value into the depth of the active layer, reducing the dose amount, and reducing the adjustably etched amount, it is possible to leave a doping carrier profile near the surface, that is, a profile where a carrier density drops in the active layer of the device intact, resulting in being able to suppress $\Delta g_m$ to a small value.

This type of FET can also be implemented by providing a larger source resistance than the conventional FET. However, as the source resistance is made larger than a predetermined value, a value of $g_m$ is made smaller, thereby making the other characteristics inferior such as a noise characteristic and a gain. Hence, the source resistance has to be an optimal value.

It is well known that the relationship between the source resistance and the $g_m$ of the deice can be represented by the following equation:

$$g_m = g_{mO}/(1 + R_s g_{mO})$$

where $g_{mO}$ denotes a $g_m$ value of an intrinsic FET from which the source resistance is excluded The equation indicates that when $R_s$ has a large value, $g_m$ can be suppressed to be a small value as $g_{mO}$ becomes larger. As a result, as shown in FIG. 1, the region where $\Delta g_m$ is small can be formed near the portion of $V_{GS} = 0$ v where $g_{mO}$ is large.

An excellent $IM_2$ characteristic was implemented when the wideband amplifier designed above (which is identical to the design shown in FIG. 5) is used as a front-end amplifier of a cable television converter. In this example, when the input signal level is $-5$ dBm and the cable television converter receives 87-channel signals over its band, $IM_2$ is guaranteed to be 60 dB or more.

In addition, in order to make the $IM_2$ characteristic of the wideband amplifier more stable and excellent, traditionally, it has been necessary to follow the troublesome steps of performing d.c. inspection of the wideband amplifiers, applying-multi-channel signals to each successful wideband amplifier like the cable television converter, and actually measuring an $IM_2$ value of each wideband amplifier for guaranteeing a proper $IM_2$ characteristic of the wideband amplifier, because the correlation between the $IM_2$ and the d.c. characteristic has been made unobvious.

The aforementioned research result, however, indicates that the $IM_2$ characteristic has a strong correlation with $\Delta g_m$ to be easily measured by the d.c. automatic inspection. Hence, to guarantee the $IM_2$ characteristic, the acceptance quality level was assumed as follows: the difference $\Delta g_m$ between a $g_m$ in case of $V_{GS} = 0.15$ V and a $g_m$ in case of $V_{GS} = -0.15$ V haS to reside within 30% of $g_{mO}$, that is, a $g_m$ in case of $V_{GS} = 0$ v. Specifically, the difference $\Delta g_m$ has to be 8 ms or lower. Since the inspection can be automated by using a low frequency or a direct current, it is possible to guarantee the $IM_2$ characteristic to be a constant value or more merely by doing $IM_2$ spot checks using a high frequency, resulting in greatly lowering the cost of the inspection process. This method has been developed by the present inventors and makes a great contribution to easy implementation of a wideband amplifier designed for suppressing a second order distortion.

As is apparent from the above description, the present invention allows implementation of a low-distortion and low-noise wideband amplifier consisting of a GaAs FET. Also, since the invention is capable of guaranteeing a second order distortion with the low-frequency automatic inspection, the inspection costs can be greatly reduced, so that it is possible to easily implement the wideband amplifier which is excellent in a second order characteristic at low cost, resulting in a great contribution to implementation of a high-efficiency wideband amplifier.

We claim:

1. A wideband amplifier concurrently receiving multi-channel signals in a predetermined frequency range and amplifying the received signals, said wideband amplifier comprising a field-effect transistor for amplifying the received signals, said field effect transistor having a substantially flat characteristic of mutual conductance versus a voltage between a gate and a source with respect to the center of an operation point for suppressing a second order intermodulation distortion of an output of said amplifier.

2. A wideband amplifier concurrently receiving multi-channel signals in a predetermined frequency range and amplifying the received signals, said wideband amplifier comprising a GaAs field effect transistor for amplifying the received signals, said GaAs field effect transistor having a substantially flat characteristic of mutual conductance versus a voltage between a gate and a source with respect to the center of an operation point for suppressing a second order intermodulation distortion of an output of said amplifier.

3. A wideband amplifier concurrently receiving multi-channel signals in a predetermined frequency range and amplifying the received signals, said wideband amplifier comprising a field effect transistor for amplifying the received signals, said field effect transistor having a substantially flat characteristic of mutual conductance versus a voltage between a gate and a source with respect to the center of an operation point for suppressing a second order intermodulation distortion of an output of said amplifier, and wherein said field effect transistor has an active layer formed by controlling the condition of ion implantation to a semiconductor substrate.

4. A wideband amplifier as in claim 1, wherein a variation of mutual conductance of said field-effect transistor is less than a predetermined value when a voltage applied between a gate and a source terminal of the field-effect transistor is varied by a predetermined value from a selected voltage level.

5. A wideband amplifier as in claim 2, wherein a variation of mutual conductance of said field-effect transistor is less than a predetermined value when a voltage applied between a gate and a source terminal of the field-effect transistor is varied by a predetermined value from a selected voltage level.

6. A wideband amplifier as in claim 3, wherein a variation of mutual conductance of said field-effect transistor is less than a predetermined value when a voltage applied between a gate and a source terminal of the field-effect transistor is varied by a predetermined value from a selected voltage level.

* * * * *